United States Patent [19]
Spaeth

[11] Patent Number: 5,812,570
[45] Date of Patent: Sep. 22, 1998

[54] LASER DIODE COMPONENT WITH HEAT SINK AND METHOD OF PRODUCING A PLURALITY OF LASER DIODE COMPONENTS

[75] Inventor: Werner Spaeth, Holzkirchen, Germany

[73] Assignee: Siemens Aktiengesellschaft, Munich, Germany

[21] Appl. No.: 723,974

[22] Filed: Sep. 30, 1996

[30] Foreign Application Priority Data

Sep. 29, 1995 [DE] Germany ................. 195 36 463.5

[51] Int. Cl.⁶ ................. H01S 3/04; H01S 3/18
[52] U.S. Cl. ................. 372/36; 372/43
[58] Field of Search ............... 372/36, 43; 228/122.1

[56] References Cited

U.S. PATENT DOCUMENTS

| 5,234,153 | 8/1993 | Bacon et al. | 228/122.1 |
| 5,299,214 | 3/1994 | Nakamura et al. | 372/36 |

FOREIGN PATENT DOCUMENTS

| 3915590C2 | 6/1994 | Germany . | |
| 43 15 581 | 11/1994 | Germany . | |
| 4025163C2 | 4/1995 | Germany . | |
| 55-153389 | 11/1980 | Japan . | |
| 57-075485 | 5/1982 | Japan . | |
| 58-052892 | 3/1983 | Japan . | |
| 58-91692 | 5/1983 | Japan | 372/36 |
| 58-207689 | 12/1983 | Japan . | |
| 3-6875 | 1/1991 | Japan | 372/36 |
| 4-286177 A | 10/1992 | Japan . | |
| 4-286178 | 10/1992 | Japan | 72/36 |

OTHER PUBLICATIONS

Japanese Patent Abstract No. 59–172787 (Ootsuka), dated Sep. 29, 1994.
Japanese Patent Abstract No. 59–172786 (Ootsuka), dated Sep. 29, 1994.

*Primary Examiner*—John D. Lee
*Assistant Examiner*—Quyen Phan Leung
*Attorney, Agent, or Firm*—Herbert L. Lerner; Laurence A. Greenberg

[57] ABSTRACT

A laser diode component includes a semiconductor body secured on a heat sink which includes a dissipator and an electrically and thermally conductive connection plate. The semiconductor body is secured to the connection plate, which in turn is applied to the dissipator. The connection plate is formed of a material having a coefficient of thermal expansion that is similar to the coefficient of thermal expansion of the semiconductor material of the semiconductor body. A connecting layer between the semiconductor body and the connection plate is preferably formed of hard solder. The dissipator is secured to the connection plate, for example through the use of a thermally conductive adhesive. A method for producing a plurality of laser diode components includes making many such laser diode components as a unit, and then subsequently cutting them apart.

12 Claims, 2 Drawing Sheets

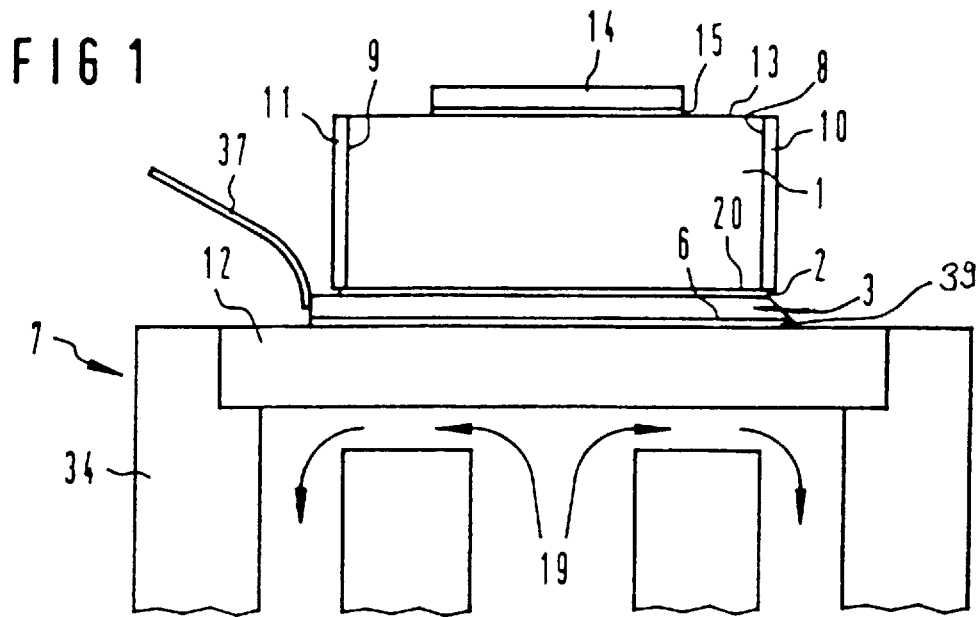
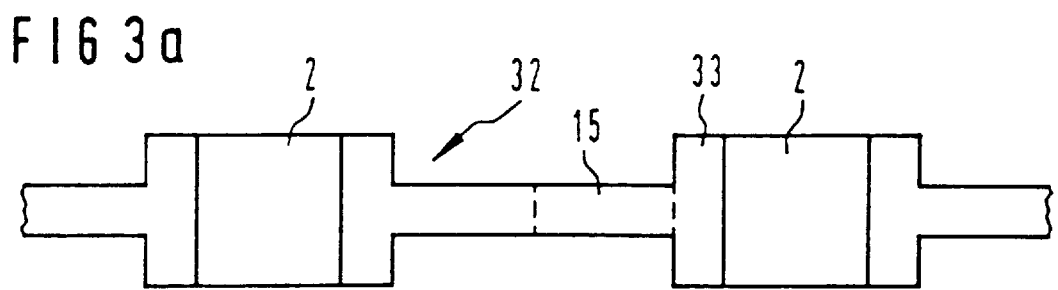
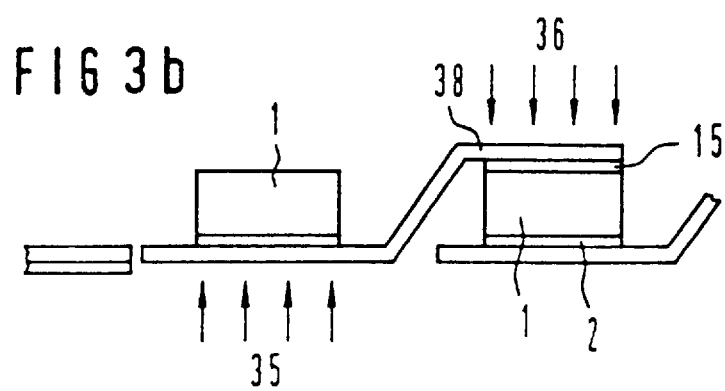

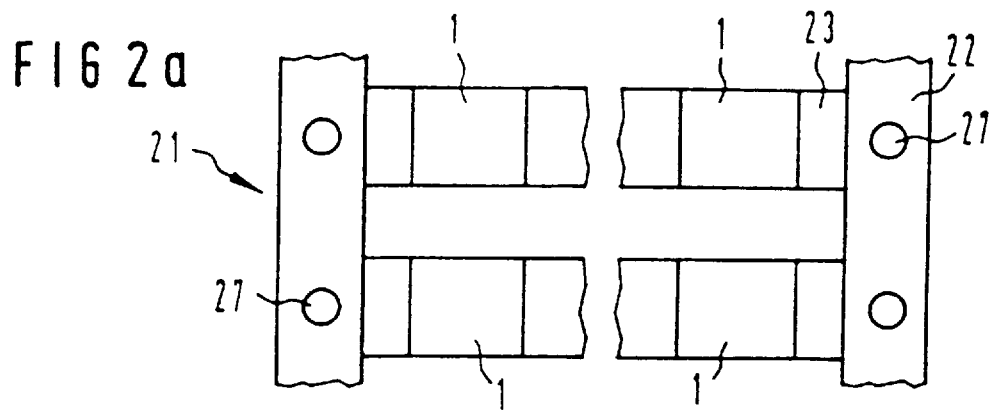
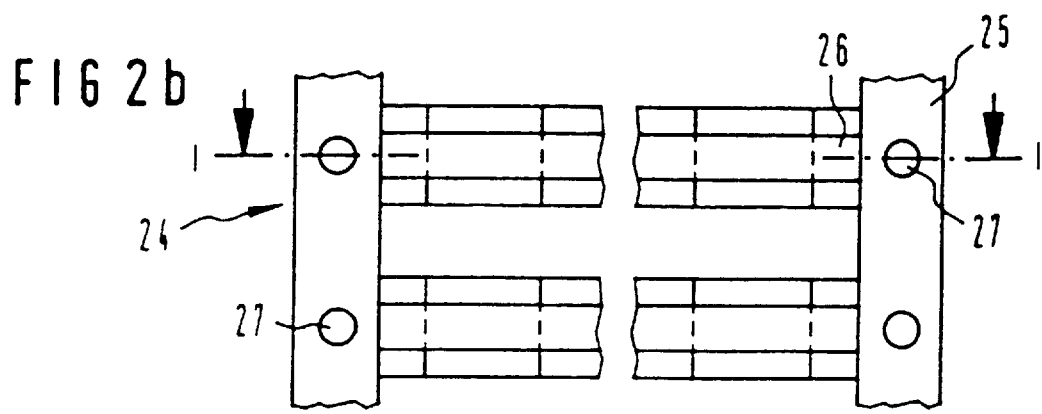
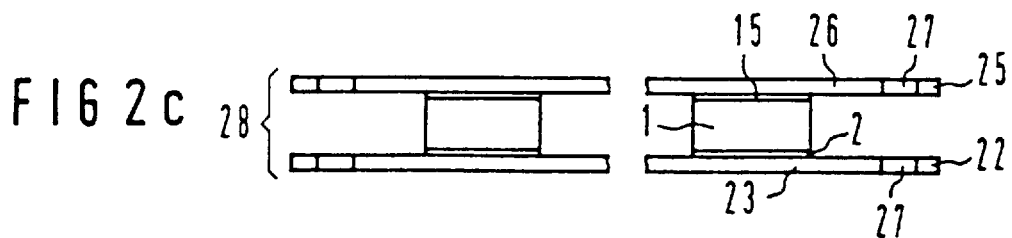
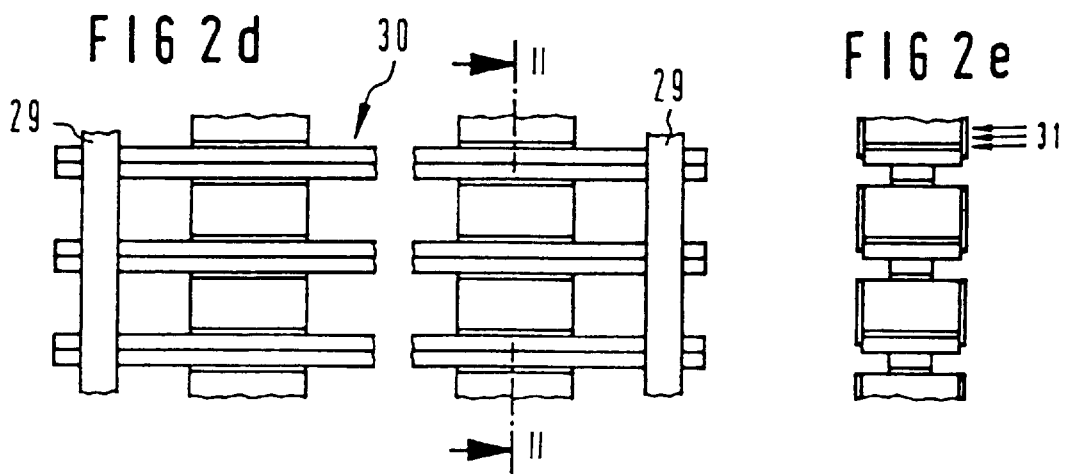
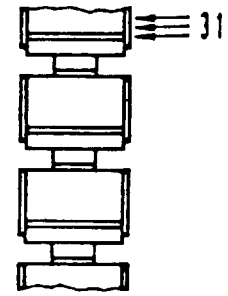

LASER DIODE COMPONENT WITH HEAT SINK AND METHOD OF PRODUCING A PLURALITY OF LASER DIODE COMPONENTS

BACKGROUND OF THE INVENTION

1. Field of the Invention

The invention relates to a laser diode component, in which a semiconductor body is secured on a heat sink having a dissipator, wherein the coefficients of thermal expansion of the semiconductor body and the dissipator differ markedly from one another. The invention also relates to a method of producing a plurality of laser diode components.

The lost heat of laser diodes, especially high-power laser diodes and laser diode bars, must be dissipated as fast and uniformly as possible. Major temperature fluctuations during operation in fact cause wavelength shifts, and an excessive temperature increase is associated with a drop in efficiency and in an extreme case can even cause destruction of the laser diode.

In a laser diode with a cooling system which is known from German Published, Non-Prosecuted Patent Application DE 43 15 581 A1, a laser diode chip is secured to a base plate made of silicon or copper. Channels are machined into the base plate or the substrate of the semiconductor body of the laser diode chip through the use of laser beam machining, stamping, electroplating and/or etching. After the base plate is joined to the semiconductor body, the channels form a so-called microchannel system. A coolant flowing in the microchannel system therefore has direct contact with the semiconductor body of the laser diode chip.

The difficulty of the above-described construction including a base plate and laser diode chip is in particular in furnishing a connection between the laser diode chip and the base plate that has aging-resistant, homogeneous electrical and thermal properties. If the coefficients of thermal expansion of the base plate material (Si, Cu) and the semiconductor material (such as GaAs, AlGaAs, and/or AlGaAsIn) differ, then during operation mechanical strains arise at the boundary between the semiconductor body and the base plate. They can often lead to partial or complete separation of the semiconductor body from the base plate. In an extreme case, the attendant worsening of heat dissipation and nonhomogeneity of current distribution can lead to the destruction of the laser diode chip.

Such problems are not solely limited to laser diodes. They arise in all semiconductor components that are exposed to major temperature fluctuations in operation.

Until now, the above-described problem has been generally countered in semiconductor technology by using an elastically or plastically deformable connecting agent, such as soft solder, to join the semiconductor body and the dissipator. The intent is that different thermal expansions of the base plate and the semiconductor body will be compensated for by the deformability of the joining agent. Known joining agents of that kind include, for instance, soft solders, such as Zn or PbZn alloys.

However, those joining agents do not meet the demands for homogeneity of the electrical and thermal properties and reliability in the presence of mechanical strain that are necessary for stable operation of the laser diode component.

SUMMARY OF THE INVENTION

It is accordingly an object of the invention to provide a laser diode component with a heat sink and a method of producing a plurality of laser diode components, which overcome the hereinafore-mentioned disadvantages of the heretofore-known devices and methods of this general type and in which a connection between a semiconductor body and the heat sink has aging-resistant homogeneous electrical and thermal properties and at the same time has high mechanical stability.

With the foregoing and other objects in view there is provided, in accordance with the invention, a laser diode component, comprising a heat sink having a dissipator; a semiconductor body secured on the heat sink; the semiconductor body and the dissipator having markedly different coefficients of thermal expansion (typically differing by approximately $2*10^{-6}$ 1/K to $3*10^{-6}$ 1/K); a first electrically and thermally conductive connection plate disposed between the semiconductor body and the dissipator; and the connection plate and the semiconductor body being formed of materials having similar coefficients of thermal expansion (typically between approximately $5*10^{-6}$ 1/K and approximately $6.5*10^{-6}$ 1/K).

In accordance with another feature of the invention, the first connection plate is formed of molybdenum, tungsten, CuW and/or CuMo, and this connection plate is secured to the semiconductor body through the use of a hard solder (further discussion of this material appears below, for instance).

In accordance with a further feature of the invention, the first connection plate is also secured to the dissipator through the use of a solder. This is possible since the aforementioned materials, especially molybdenum, for the connection plate have a very high modulus of elasticity and therefore largely compensate for mechanical strains.

In accordance with an added feature of the invention, the first connection plate is used simultaneously as a first electrical connection of the semiconductor body and as a thermal connection with the dissipator.

In accordance with an additional feature of the invention, there is provided a second connection plate secured to the semiconductor body and serving as an electrical connection of the semiconductor body.

In accordance with yet another feature of the invention, the connection plates are disposed on opposite sides of the semiconductor body.

In accordance with yet a further feature of the invention, the second connection plate is formed of a material having a coefficient of thermal expansion similar to the material of the first connection plate.

In accordance with yet an added feature of the invention, the semiconductor body is substantially formed of GaAs, AlGaAs, and/or InAlGaAs; the dissipator includes a cooling plate of diamond, silicon or copper; and the connection plate is substantially formed of molybdenum, tungsten, CuMo and/or CuW.

In accordance with yet an additional feature of the invention, there is provided a connecting layer having a layer sequence including Ti—Pt—AuSn, the first connection plate being secured to the semiconductor body by the connecting layer.

With the objects of the invention in view there is also provided a method for producing a plurality of laser diode components, which comprises securing the plurality of semiconductor bodies on a first conductor strip formed of the material of the first connection plate; securing a second conductor strip being formed of the material of the second connection plate, to the plurality of semiconductor bodies;

cutting a sandwich including the two conductor strips and the plurality of semiconductor bodies into individual laser diodes or laser diode arrays; and applying mirror films on two opposed side surfaces of the semiconductor bodies.

With the objects of the invention in view there is additionally provided a method for producing a plurality of laser diode components, which comprises repeating the following steps securing a first semiconductor body on a conductor strip formed of the material of the connection plate; severing the conductor strip next to the first semiconductor body, defining a separated portion of the conductor strip; deforming the portion of the conductor strip separated from the first semiconductor body for placing a lower surface of a partial region of the separated portion of the conductor strip at a level of the upper surface of the first semiconductor body; securing the partial region of the conductor strip to the upper surface of the first semiconductor body; securing a second semiconductor body on the portion of the conductor strip separated from the first semiconductor body; and cutting the conductor strip apart between the first and second semiconductor bodies, or between individual groups including a plurality of serially connected semiconductor bodies to produce laser diode arrays.

Other features which are considered as characteristic for the invention are set forth in the appended claims.

Although the invention is illustrated and described herein as embodied in a laser diode component with a heat sink and a method of producing a plurality of laser diode components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, sectional view of an exemplary embodiment of the invention;

FIGS. 2a, 2b and 2d are fragmentary, plan views illustrating a first method for producing a plurality of laser diode components according to the invention;

FIG. 2c is a sectional view taken along a line A—A of FIG. 2b, in the direction of the arrows;

FIG. 2e is a sectional view taken along a line B—B of FIG. 2d, in the direction of the arrows; and FIGS. 3a and 3b are respective fragmentary, plan and elevational views illustrating a second method for producing a plurality of laser diode components according to the invention.

DESCRIPTION OF THE PREFERRED EMBODIMENTS

Referring now to the figures of the drawings in detail and first, particularly, to FIG. 1 thereof, there is seen a laser diode component that is a lateral-projection high-power laser diode, having a semiconductor body 1 which, for instance, is formed of GaAs, AlGaAs and/or InAlGaAs. One mirror film 10, 11 is applied to each end surface 8, 9 of the semiconductor body 1. $Al_2O_3$, Si, $SiO_2$, $Si_3N_4$ or SiC, for instance, is used as a mirror material. The semiconductor body 1 is secured through the use of an electrically and thermally conducting connecting layer 2 to a connection plate 3. The connecting layer 2, for instance, is formed of an electrically and thermally conductive adhesive or a hard solder, such as an AuSn alloy, and if needed can be structured, for instance with a mask technique or photolithography. Examples of application methods that can be used are sputtering, vapor deposition or immersion. In order to improve soldering properties of the connection plate 3 and aging resistance of the soldered connection, an electrically conductive layer of some suitable metal or a succession of metal layers (for instance, TiPt, TiPd, TiPtAu or a TiPdAu layer sequence) may, for instance, be applied to the connection plate 3.

A connection wire 37 is bonded or soldered to the connection plate 3, which is used as both a thermal and an electrical connection for the semiconductor body 1. A side surface of the connection plate 3 adjoining the beam exit surface 8 of the semiconductor body 1 is beveled in such a way that on one hand maximum heat dissipation is assured and on the other hand no reflections of the laser beam on the connection plate 3 that could interfere with the laser beam occur. A further connection plate 14 is secured to an upper surface 13 of the semiconductor body 1 through the use of a further connecting layer 15, which may be formed of the same material as the connecting layer 2. This connection plate 14 need not have the same thickness as the connection plate 3. A sandwich including the semiconductor body 1 and the connection plates 3, 14 is secured at a lower surface 6 of the connection plate 3 to a dissipator 7, including a cooling plate 12 and a coolant supply 34. Alternatively, the dissipator may also be constructed without a cooling plate, so that a coolant is directly in contact with the connection plate 3. However, instead of the connection plate 14 on the upper surface 13 of the semiconductor body 1, one or more contact metallizations that are produced, for instance, through the use of vapor deposition or sputtering, may be applied. They may be formed of aluminum or an aluminum base alloy, if wire bonding is to be carried out, or of TiPtAu, if soldering is to be carried is out.

In order to keep mechanical strains at boundaries between the semiconductor body 1 and the connection plates 3, 14 caused by different thermal expansion as slight as possible, the connection plates 3, 14 preferably are formed of a material that has a similar coefficient of expansion to the material of the semiconductor body 1. Moreover, this material must have good electrical and thermal conductivity, since at least the connection plate 3 is used both to supply current and to dissipate heat. In the case of a semiconductor body 1 of GaAs, AlGaAs, and/or InGaAsP, molybdenum is, for instance, a material that meets the above-mentioned demands.

The thickness of the connection plate 3 is, for example, between 10 and 100 $\mu$m, and the thickness of the connecting layer 2 is between 1 and 2 $\mu$m. This assures that the thermal resistance of these two components is slight, and the heat produced during operation in the semiconductor body 1 is dissipated largely unhindered to the cooling plate 12.

One advantage of the laser diode component shown in FIG. 1, among others, is that the semiconductor body 1 can be soldered in a simple, reliable way, to the connection plate 3, since because of its slight thickness the connection plate 3 can be heated very exactly, in accordance with a specified temperature program, to the desired soldering temperature or temperatures. A temperature-time profile that can be performed exactly is known to be of substantial significance in the production of homogeneous, replicable soldered connections.

A high-power semiconductor laser is preferably suitable for the soldering, for instance, since its power can be regulated easily and accurately, and thus the temperature and duration of the soldering operation can be adjusted accurately. The soldering operation can, for instance, be carried out by irradiating the lower surface 6 of the connection plate 3 with laser radiation. If necessary, the connection plate 3 may also be preheated.

The cooling plate 12, for instance, is formed of diamond (coefficient of thermal expansion $a_{th}=1.1*10^{-6}$ 1/K), silicon ($a_{th}=2.3*10^{-6}$ 1/K), and/or copper ($a_{th}=16.6*10^{-6}$ 1/K), or some other material with good thermal conductivity. A metal soft solder, such as Zn or PbZn alloys, or a thermally conducting elastic adhesive is, for instance, suitable as a connecting material 39 between the cooling plate 12 and the connection plate 3. However, if a connection plate material having a high modulus of elasticity is used, a hard solder, such as an AuSn alloy, is also suitable. The cooling plate 12 is permanently cooled with the aid of a coolant 19, which is brought to the cooling plate 12 and removed from it again through the coolant supply 34. Water is, for instance, is used as the coolant 19.

In the exemplary embodiment of FIG. 1, the connection plate 14 acts solely as an electrical connection for the laser diode. If needed, however, a cooling plate can also be applied to this connection plate 14, in order to provide additional cooling of the semiconductor body 1. It is equally possible, if only electrical contacting is contemplated, for a contact metallization, for instance of aluminum or an aluminum base alloy, to be applied instead of a cooling plate 14 on the semiconductor body 1.

Once the semiconductor body 1 has been secured to the connection plate 3, the laser diode component can be glued, soldered or welded to the prefabricated dissipator 7 in a simple way, for instance through the use of a thermally conductive adhesive. Since the connecting material between the connection plate 3 and the dissipator 7 need not have electrical conductivity, it can be formed of an elastic adhesive that is filled with a thermally conductive material to produce thermal conductivity. Mechanical strains resulting from highly different coefficients of thermal expansion of the semiconductor material and dissipator material can thus be largely compensated for.

In order to cool the semiconductor body 1, a conventional lamination cooler or a microchannel cooler may, for instance, be used instead of the cooling plate 12 of FIG. 1.

The production of a thermally and electrically homogeneous and mechanically stable connection between a semiconductor body 1 and a connection plate 3, 14 is known by experience to be very difficult whenever contact surfaces, which number two in the exemplary embodiment, namely the upper surface 13 and a lower surface 20 of the semiconductor body 1, are contaminated with a material that only poorly moistens the connecting layer 2, 15. Such contamination often occurs, for example, in the production of the mirror films or layers 10, 11 of the optical resonator of a laser diode. These mirror films 10, 11 are generally applied immediately after the production of the semiconductor body 1. It is therefore only possible to prevent contamination of the contact surfaces of the semiconductor body 1 with mirror material at extremely great effort.

This problem can be solved by using the above-described connection plate or plates 3, 14, in such a way that the mirror films 10, 11 are applied after the semiconductor body 1 is secured to the connection plate or plates 3, 14. The homogeneity and reliability of the connecting layers 2, 15 and their replacability can be improved markedly thereby in comparison with connection layers made by the known method steps. In order to prevent portions of the side surfaces 8, 9 of the semiconductor body 1 from being shaded during mirror coating, and to prevent interference of the laser beam transmitted by the semiconductor body 1 from reflection on the connection plate or plates 3, 14, the connection plate or plates 3, 14 may be no wider or only slightly wider than the resonator length (which equals the distance between the two mirror films 10, 11) of the laser diode.

The width of the connection plate 3 and of the connection plate 14 may, for instance, correspond to the resonator length of the laser diode or be less than the resonator length. The semiconductor body 1 is then positioned on the connection plate 3 in such a way that its laser beam exit surface is flush with a side surface of the connection plate 3. As is shown in FIG. 1, the side surface of the connection plate 3 adjoining the laser beam exit surface may also be beveled in such a way that the laser radiation is not interfered with, and at the same time maximum heat dissipation is assured.

The use of the connection plate or plates 3, 14 according to the invention is especially advantageous for the just-described order of the method steps. It is in fact permissible, because of the adaptation of the thermal expansion of the connection plates 3, 14, to have the mirror films 10, 11 extend beyond the semiconductor body 1, without increasing their danger of breakage from mechanical strains resulting from different thermal expansions. This last problem might admittedly also be solved by applying the mirror films 10, 11 only to the semiconductor body 1. However, the requirement that the mirror films 10, 11 have the same thickness throughout simultaneously on both side surfaces 8, 9 would be attainable only at very great effort and expense for process technology. Nevertheless, a uniform thickness of the mirror films 10, 11 is absolutely necessary if the most interference-free laser radiation possible is to be produced.

FIGS. 2a–2e diagrammatically illustrate a method with which many semiconductor bodies 1 can be produced in a simple, rational way, each with one connection plate 3, 14 on the lower surface 20-and upper surface 13, respectively. In this method, first a plurality of semiconductor bodies 1 are secured to a first conductor strip 21, to which the material of the connecting layer 2 has already been applied. The first conductor strip 21 is formed of the material of the connection plate 3 and has two peripherally perforated guide and transport strips 22, which are joined to one another through lands 23 that are separate from one another. After the semiconductor body 1 has been mounted on the conductor strip 21, a second conductor strip 24 is secured to the upper surfaces 13 of the semiconductor bodies 1. Like the first conductor strip 21, the second conductor strip 24 has two peripheral perforated guide and transport strips 25, which are connected to one another through separate lands 26. Once again, the material of the connecting layer 15 has already been applied to the conductor strip 24 or the semiconductor body 1. The conductor strip 24 preferably is formed of the same material as the conductor strip 21. The lands 26 of the conductor strip 24 are narrower than the lands 23 of the conductor strip 21, but the patent scope is not to be considered limited to this particular case. The lands 23 and 26 could equally well have the same width, or the lands 26 could be wider than the lands 23.

Laser soldering as described above or any other suitable soldering method may be employed as a soldering method for firmly joining the conductor strips 21 and 24.

The above-described sandwich-like composite of the two conductor strips 21, 24 and the semiconductor bodies 1 is cut apart between the lands 23, 26 to produce individual strips 28. FIG. 2c shows a section through such an individual strip 28, along a section line A—A of FIG. 2b. In order to provide further processing, for instance for mirror coating, it is possible next, as is shown in FIG. 2d, for a plurality of such individual strips 28 to be placed on guide rails 29 which, for instance, extend through perforation holes 27 and are stacked on one another. A section taken through such a stacked composite 30 along a section line B—B of FIG. 2d is shown in FIG. 2e. In this case arrows 31 indicate a coating of the side surfaces of the semiconductor bodies 1 with mirror material, for instance by vapor deposition. Once the composites including the semiconductor bodies 1 and connection plates 3, 14 are finished, the stacked composite 30 is separated into the desired units, individual chips, or arrays of a plurality of laser diodes.

A second method variant, shown in FIGS. 3a and 3b, for rationally connecting a plurality of semiconductor bodies 1 to connection plates 3, 14, is suitable in particular for producing series circuits including a plurality of laser diode components. In this method, a conductor strip 32 is used that has widened portions 33 at certain intervals. The conductor strip 32 is provided with the connecting layers 2 and 15 on its respective upper and lower surfaces in contact regions, and once again it is formed of a material having a coefficient of thermal expansion similar to that of the semiconductor material of the semiconductor body 1. A hard solder, such as an AuSn alloy, is suitable as the material for the connecting layers 2, 15. The connecting layers 2, 15 may equally well be applied to the semiconductor bodies 1 before assembly.

The course of assembly in the method variant diagrammatically shown in FIGS. 3a and 3b for producing a plurality of individual components or a plurality of series circuits including a plurality of laser diode components, has the following successive method steps:

1. Securing a semiconductor body 1 to a widened portion 33 of the conductor strip 32, for instance by laser soldering through the use of laser irradiation 36 of the lower surface of the conductor strip 32;
2. Cutting through the conductor strip 32 in the narrow region of the conductor strip 32;
3. Bending the conductor strip 32 in such a way that a lower surface of at least a partial region 38 of the separated portion the narrow region of the conductor strip 32 comes to rest at the level of the upper surface 13 of the semiconductor body 1;
4. Pushing the narrow region of the conductor strip 32 over the adjacent semiconductor body 1;
5. Securing the narrow region of the conductor strip 32 to the semiconductor body 1, for instance through the use of laser irradiation 36; and
6. Repeating the procedure, beginning with step 1.

After the conductor strip assembly, if necessary, it is also possible in this method to apply cover layers, such as mirror films for an optical resonator of a laser diode, to the semiconductor body 1.

In the method shown in FIGS. 2a and 2b, the use of a conductor strip with the same width throughout is also conceivable, if this is advantageous or necessary.

The conductor strip 32 may be provided with holes at certain intervals, so that optionally conductor strip segments with semiconductor bodies 1 can be slipped onto guide rails and stacked on one another, similarly to what is shown in FIG. 2d.

The above-described structural types of laser diode components and methods for their production are not limited to individual laser diode components, such as individual laser diodes and individual transistors, but instead can equally well be employed in laser diode bars and integrated circuits.

Nor is the above-described invention limited solely to use with laser diode components. Instead, it can be used with all components in which a semiconductor body must be connected with good thermal conductivity to a dissipator. Examples are high-power transistors and thyristors, etc.

I claim:

1. A laser diode component, comprising:
    a heat sink having a dissipator;
    a semiconductor body secured on said heat sink;
    said semiconductor body and said dissipator having markedly different coefficients of thermal expansion;
    an electrically and thermally conductive connection plate disposed between said semiconductor body and said dissipator;
    said connection plate and said semiconductor body formed of materials having similar coefficients of thermal expansion;
    a hard solder securing said semiconductor body to said connection plate;
    said connection plate simultaneously serving as an electrical connection of said semiconductor body and as a thermal connection with said dissipator;
    another connection plate secured to said semiconductor body and serving as an electrical connection of said semiconductor body;
    said other connection plate formed of a material having a coefficient of thermal expansion similar to said material of said connection plate disposed between said semiconductor body and said dissipator; and
    said other connection plate secured to said semiconductor body with said hard solder.

2. The laser diode component according to claim 1, wherein said dissipator is secured to said connection plate.

3. The laser diode component according to claim 1, wherein said semiconductor body is substantially formed of a material selected from the group consisting of at least one of GaAs, AlGaAs, and InAlGaAs; said dissipator is selected from the group consisting of diamond, silicon and copper; and said connection plate is selected from the group consisting of molybdenum and tungsten.

4. The laser diode component according to claim 1, wherein said connection plates are disposed on opposite sides of said semiconductor body.

5. A laser diode component, comprising:
    a heat sink having a dissipator;
    a semiconductor body secured on said heat sink;
    said semiconductor body and said dissipator having markedly different coefficients of thermal expansion;
    an electrically and thermally conductive connection plate disposed between said semiconductor body and said dissipator;
    said connection plate and said semiconductor body being formed of materials having similar coefficients of thermal expansion; and
    a connecting layer having a layer sequence including Ti—Pt—AuSn,
    said connection plate between said semiconductor body and said dissipator secured to said semiconductor body by said connecting layer.

6. The laser diode component according to claim 5, wherein said semiconductor body is secured to said connection plate with a hard solder.

7. The laser diode component according to claim 5, wherein said connection plate simultaneously serves as an electrical connection of said semiconductor body and as a thermal connection with said dissipator.

8. The laser diode component according to claim 5, including another connection plate secured to said semiconductor body and serving as an electrical connection of said semiconductor body.

9. The laser diode component according to claim 8, wherein said connection plates are disposed on opposite sides of said semiconductor body.

10. The laser diode component according to claim 8, wherein said other connection plate is formed of a material having a coefficient of thermal expansion similar to said material of said connection plate between said semiconductor body and said dissipator.

11. The laser diode component according to claim 5, wherein said dissipator is secured to said connection plate.

12. The laser diode component according to claim 5, wherein said semiconductor body is substantially formed of a material selected from the group consisting of at least one of GaAs, AlGaAs, and InAlGaAs; said dissipator is selected from the group consisting of diamond, silicon and copper; and said connection plate is selected from the group consisting of molybdenum and tungsten.

* * * * *